(12) United States Patent
Feng et al.

(10) Patent No.: US 7,262,067 B2
(45) Date of Patent: Aug. 28, 2007

(54) METHOD FOR CONDUCTIVE FILM QUALITY EVALUATION

(75) Inventors: Hsien-Ping Feng, Yonghe (TW); Min-Yuan Cheng, Taipei (TW); Hsi-Kuei Cheng, Jhubei (TW); Steven Lin, Shih-Chu (TW); Huang-Yi Huang, Hsin-Chu (TW); Yuh-Da Fan, Shin Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 457 days.

(21) Appl. No.: 10/830,577

(22) Filed: Apr. 23, 2004

(65) Prior Publication Data

US 2005/0239221 A1 Oct. 27, 2005

(51) Int. Cl.
*H01L 21/66* (2006.01)
(52) U.S. Cl. .......................... 438/17; 324/693
(58) Field of Classification Search .................. 438/14, 438/669, 672, 687, 17; 324/691, 693
See application file for complete search history.

(56) References Cited

U.S. PATENT DOCUMENTS 4,663,753 A * 5/1987 Goldstein .................. 369/132
6,730,598 B1 * 5/2004 Yu .............................. 438/680
7,019,519 B2 * 3/2006 Le .............................. 324/230
2004/0180541 A1 * 9/2004 Joshi ........................ 438/675

OTHER PUBLICATIONS

Nestorovic, Svetlana, "Influence of Alloying and Secondary Annealing on Anneal Hardening Effect at Sintered Copper Alloys," Bull. Mater. Sci., vol. 28, No. 5, Aug. 2005, pp. 401-403 Indian Academy of Sciences.*

* cited by examiner

*Primary Examiner*—Zandra V. Smith
*Assistant Examiner*—Toniae M. Thomas
(74) *Attorney, Agent, or Firm*—Duane Morris LLP

(57) ABSTRACT

A method for monitoring copper film quality and for evaluating the annealing efficiency of a copper annealing process includes measuring hardness of a copper film formed on a substrate before and after annealing and comparing the hardness measurement results. The measurements can be correlated to grain boundary saturation levels, copper grain sizes and therefore conductivity. Hardness measurements may be taken at a plurality of locations throughout the substrate to account for variations in the copper film grain structure.

23 Claims, No Drawings

METHOD FOR CONDUCTIVE FILM QUALITY EVALUATION

FIELD OF THE INVENTION

This invention relates to semiconductor devices and methods for making the same. More particularly, this invention relates to monitoring the film quality of conductive films used in semiconductor devices and the effectiveness of the annealing processes used to anneal such films.

BACKGROUND OF THE INVENTION

As devices shrink and levels of integration increase in today's rapidly emerging semiconductor manufacturing industry, it is critical to accurately monitor the components used to form semiconductor devices, including the materials used to form the components. This monitoring is especially critical for the conductive interconnect features used to couple the thousands of discrete component devices that combine to form an integrated circuit. High speed devices, in particular, require that the conductive interconnect materials used to couple the discrete components to one another and to bond pads for external communication, are high quality materials with high conductivities required for carrying high speed signals. Various metals have been used as conductive interconnects in semiconductor devices. Copper is a metal that is a favored conductive interconnect material for high speed devices because of its high conductivity and current carrying ability. It is therefore particularly critical to be able to evaluate the film quality of a copper interconnect film, particularly the resistivity and/or conductivity of the copper film which affects its current carrying ability. The conductivity of a copper film is known to be related to grain size of the film.

After a conductive material such as copper is initially formed as a film on a substrate to act as an interconnect material, the conductive material is annealed to improve various of its qualities including its current carrying speed. Annealing refers to a heat treatment wherein the microstructure of the material is altered causing changes in properties such as strength and hardness. Annealing typically results in softening of the conductive material through removal of crystal defects and the internal stresses which they cause. During the annealing process, the grain boundaries of the conductive material are typically reduced to minimum values, or saturated. Conversely, grain size is increased. This grain boundary variation influences conductivity which varies directly with grain size and conversely with hardness. Since the annealing process is intended to improve the quality of the copper film for its intended use, it would also be advantageous to monitor and evaluate the effectiveness of the annealing process, as well as the annealed copper film.

Conventional techniques for monitoring the film quality of a copper film and for determining its conductivity utilize a sheet resistance measurement, referred to as "sheet rho", Rs. Annealing efficiency is conventionally monitored by comparing sheet rho measurements before and after annealing. A shortcoming of the sheet resistance measurement is that it estimates the film resistivity determine conductivity and therefore the speed of the copper interconnect, whereas the conductivity is actually more directly dependent upon the grain size of the copper film. The sheet resistance measurement, however, cannot measure grain size. In other words, the Rs measurement will be the same regardless of the saturation level of the copper grain boundaries or the copper grain sizes, because it is insensitive to differences in grain structure. Moreover, the sheet rho of the film is typically measured at one point using a 4-point probe and this localized measurement is therefore insensitive to variations in film resistivity throughout the film. Such a measurement technique necessarily relies on the assumption that the bulk resistivity is constant throughout the film, but in practice, it is not. Therefore, a sheet resistivity measurement is an inaccurate way to measure conductivity which depends on grain size and the conventional single, localized 4-point probe sheet resistivity measurement is also insensitive to variations in the bulk resistivity throughout the film which may be due to different grain structures in both annealed and unannealed films. In summary, this 4-point probe measurement of sheet resistivity is an inaccurate way of monitoring copper film quality, or the effectiveness or efficiency of the annealing process intended to improve conductivity and increase grain size.

It would therefore be desirable to provide a method for easily and accurately monitoring the conductivity of a film and the effectiveness of an annealing operation used to saturate grain boundaries of a film and improve its conductivity.

SUMMARY OF THE INVENTION

To address these and other objects and in view of its purposes, the present invention provides a method for evaluating copper film quality by forming a copper film on a substrate, measuring hardness of the copper film and evaluating conductivity of the copper film based on the measured hardness.

In another embodiment, the present invention provides a method for evaluating copper film quality and annealing effectiveness. The method includes forming a copper film on a substrate, measuring hardness of the copper film, annealing the copper film to produce an annealed copper film, measuring the annealed hardness of the annealed copper film and evaluating conductivity of the annealed copper film and the annealing effectiveness, based on the measured annealed hardness of the annealed copper film.

DETAILED DESCRIPTION

The present invention is directed to determining metal film quality of as-deposited and annealed metal films and also to evaluating the annealing effectiveness of the metal film by using hardness measurements of the metal film. The annealing effectiveness can be evaluated by comparing the pre-anneal hardness measurements and the post-anneal hardness measurements and annealing efficiency can be determined by factoring in annealing time or degree of change in the measured parameter or other derived parameter. The present invention is directed to using such hardness measurements to evaluate a number of various metal films used as conductive materials in the semiconductor industry. One particular conductive film of interest and which can advantageously be evaluated using the present invention, is copper.

Copper is increasingly being used as the interconnect material in various semiconductor devices which employ high operating speeds. Copper is used in various technologies and therefore may be formed on various substrates to be used as a conductive interconnect material in an active semiconductor device after it is patterned and annealed using conventional techniques.

The present invention provides for forming a copper film on various suitable substrates upon which semiconductor devices are formed. The copper film may be formed on the substrate using various deposition processes such as sputtering, evaporation, electroplating, and various other suitable and conventional film formation techniques. The copper film may be formed to various thicknesses and may range from 1000 to 2500 angstroms in one exemplary embodiment. Various techniques are available and may be used to measure thickness.

A hardness measurement is made of the copper film prior to anneal. The pre-anneal hardness measurement may take place prior to or following the patterning of the copper film. In one embodiment, the copper film may be patterned prior to measurement using conventional damascene patterning methods including chemical mechanical polishing (CMP). The hardness measurement may measure nano-hardness or micro-hardness. Various hardness measurement techniques are available and may be used. In one embodiment, a Knoop hardness test may be carried out. In other exemplary embodiments, a Rockwell hardness test, a Brinell hardness test or a Vickers hardness test may be used. Various measurement systems and instruments are available and may be used to carry out the hardness measurement. One particular instrument that may be used to measure hardness is the NHTI Nano-Hardness Tester by CSEM Instruments Other instruments may be used in other exemplary embodiments. In general, the hardness test measures the copper metal's resistance to the penetration of a non-deformable probe such as a ball or cone. The hardness test generally determines the depth which such a ball or cone sinks into the copper under a given load within a specific period of time, but various other hardness measurement techniques may be used as well. The hardness measurements may advantageously be carried out at a plurality of locations on the substrate and they may be carried out on product substrates or test substrates that do not include the topology of the product devices being fabricated. The hardness measurements at various locations across the substrate may advantageously be averaged to correct for local variations and to generate a representative average hardness of the film. Various hardness measurement scales and units may be used and many measurement techniques include their own unitless scales.

The copper film is then heat treated in an annealing process. The annealing may take place prior to or following the patterning of the copper film. In one exemplary embodiment, the annealing process may take place at a temperature within the range of 150-250° C. but other temperatures may be used in other exemplary embodiments. The annealing time may range from 30 to 120 seconds in an exemplary embodiment, but other annealing times may be used in other exemplary embodiments. The annealing process may be carried out using any of various suitable inert gases that do not contain oxygen. During the annealing process, structural or crystal defects and the internal stresses which they cause, are removed from the copper. A softened film is produced. Grain boundaries of the copper film are typically reduced to minimum values or saturated and the average grain size therefore increases, improving the current carrying ability of the copper. The grain size of the copper film directly affects its conductivity and therefore its viability as a high speed interconnect. In an exemplary embodiment, the annealing process may be targeted to increase the average copper grain size from 0.1 µm to 1.0 µm. Generally speaking, as saturation levels increase, grain size increases, the number of grain boundaries is minimized, and conductivity increases. Applicants have discovered that film hardness is directly related to copper grain size. As grain size and conductivity increase, hardness decreases. Film hardness has been found to be a function of film thickness and grain size.

After annealing, a post-annealing hardness measurement is carried out. As with the pre-anneal hardness measurements, the annealed film may advantageously be measured at various and multiple locations throughout the copper film. The plurality of measurements taken throughout the copper film formed over the substrate is particularly advantageous because copper grain size may not be uniform throughout the film and further because copper grain growth may not be uniform throughout the film during the annealing process. If the copper film has been patterned, a number of suitably large areas for hardness measurement should be selected. The post-anneal hardness measurement may be carried out using various instruments as described above. The post-annealing hardness measurement may advantageously be carried out using the same instrument used to carry out the pre-anneal hardness measurements.

Since film thickness can be determined using various conventional techniques, the hardness measurement of the copper film can be used to determine grain size and therefore conductivity and suitability of the film as a conductive interconnect for both pre- and post-anneal hardness measurements. From the thickness measurement and the hardness, the copper grain size can be determined by means of a correlation that may be established between grain size and hardness, for various thicknesses. Various correlations may be made between grain size and hardness for an approximate film thickness by measuring grain size and hardness on a number of samples. In other embodiments, various techniques may be used to generate correlations between grain size and conductivity and between copper film hardness and conductivity as a function of thickness.

The present invention thereby provides for determining copper film quality and also provides for evaluating annealing effectiveness by comparing hardness measurements of the un-annealed film to hardness measurements of the annealed film to evaluate the change in conductivity or other characteristic attributable to the change in grain size during the annealing process. The annealing efficiency can be determined by calculating the percentage change in the measured or derived parameter of interest such as hardness, grain size, or conductivity, or the degree of grain boundary saturation. This may be compared to targeted or typical changes in the respective characteristics to assess annealing efficiency After the post-annealing hardness measurement is made, and the conductivity of the copper film determined, a determination is made as to whether the particular annealed copper film is suitable for product use or is unusable in its current state. If unusable, the copper film may be re-annealed and its hardness re-measured. Additionally, after the pre- and post-annealing measurements are compared and the annealing efficiency determined, the annealing process and the copper film quality may be evaluated. Feedback control loops may be established. In one embodiment in which the annealing process itself is suspect, the control loop may be utilized to suggest or make changes in the annealing process. In another scenario in which the quality of the as-deposited copper film appears to be deficient the control loop may be used to study and/or alter the copper film formation process.

The preceding merely illustrates the principles of the invention. It will thus be appreciated that those skilled in the art will be able to devise various arrangements which, although not explicitly described herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for evaluating copper film quality comprising:
   forming a cooper film on a substrate;
   measuring hardness of said copper film;
   annealing said copper film to produce an annealed copper film;
   further measuring annealed hardness of said annealed copper film; and
   evaluating conductivity of said annealed copper film based on said annealed hardness.

2. The method as in claim 1, further comprising evaluating effectiveness of said annealing by comparing a measured hardness of said copper film to a measured annealed hardness of said annealed copper film.

3. The method as in claim 2, wherein said evaluating further comprises estimating a change in average grain size of said copper film during said annealing.

4. The method as in claim 2, further comprising providing feedback to at least one of said annealing and a formation process used to form said copper film, based on at least one of said evaluating conductivity and said evaluating effectiveness.

5. The method as in claim 4, in which said providing feedback includes re-annealing said copper film.

6. The method as in claim 2, wherein at least one of said evaluating conductivity and said evaluating effectiveness further comprises establishing a correlation between copper film hardness and conductivity.

7. The method as in claim 2, wherein at least one of said evaluating conductivity and said evaluating effectiveness further comprises establishing a correlation between copper film hardness and grain size.

8. The method as in claim 1, wherein at least one of said measuring and said further measuring comprises using a probe that penetrates said copper film.

9. The method as in claim 1, wherein said annealing takes place at a temperature within the range of 150-250° C. and is carried out for 30-120 seconds.

10. The method as in claim 1, wherein said evaluating conductivity includes determining conductivity of said annealed copper film based on said annealed hardness and a thickness of said annealed copper film.

11. The method as in claim 1, wherein at least one of said measuring and said further measuring comprises measuring at least one of micro-hardness and nano-hardness.

12. The method as in claim 1, wherein at least one of said measuring and said further measuring comprises at least one of a Knoop hardness measurement and a Rockwell hardness measurement.

13. The method as in claim 1, wherein said measuring and said further measuring comprise measuring at a plurality of locations on said substrate.

14. The method as in claim 1, wherein said forming a copper film comprises depositing said copper film on a semiconductor substrate and further comprising using said annealed copper film as an interconnect in an active integrated circuit.

15. The method as in claim 1, further comprising patterning said copper film using damascene patterning methods including chemical mechanical polishing, prior to said measuring.

16. A method for evaluating copper film quality comprising:
   forming a copper film on a semiconductor substrate;
   measuring film hardness of said copper film; and
   evaluating conductivity of said copper film based on said measuring.

17. The method as in claim 16, further comprising:
   annealing said copper film after said measuring to produce an annealed copper film;
   measuring an annealed film hardness;
   evaluating conductivity of said annealed copper film based on measured annealed film hardness; and
   evaluating anneal effectiveness by comparing said measured annealed film hardness to said measured film hardness.

18. The method as in claim 16, wherein said evaluating conductivity of said copper film is further based on a thickness of said copper film.

19. The method as in claim 17, wherein at least one of said measuring film hardness and said measuring an annealed film hardness comprise measuring with a nano-hardness tester.

20. The method as in claim 16, wherein said evaluating further comprises establishing a correlation between copper film hardness, grain size and conductivity, as a function of said thickness.

21. The method as in claim 1, wherein said copper film is not cold rolled.

22. The method as in claim 1, wherein said forming comprises one of sputtering, evaporation, and electroplating.

23. The method as in claim 1, wherein said forming a copper film comprises forming a copper film to a thickness within the range of 1000 to 2500 angstroms.

* * * * *